United States Patent
Besling et al.

(10) Patent No.: US 9,557,238 B2
(45) Date of Patent: Jan. 31, 2017

(54) PRESSURE SENSOR WITH GETER EMBEDDED IN MEMBRANE

(71) Applicant: NXP B.V., Eindhoven (NL)

(72) Inventors: Willem Besling, Eindhoven (NL);
Martijn Goossens, Eindhoven (NL);
Peter Steeneken, Eindhoven (NL);
Remco Pijnenburg, Eindhoven (NL);
Marten Oldsen, Kleve (DE); Casper van der Avoort, Prinsenhof (DE)

(73) Assignee: ams International AG, Rapperswil (CH)

( * ) Notice: Subject to any disclaimer, the term of this patent is extended or adjusted under 35 U.S.C. 154(b) by 159 days.

(21) Appl. No.: 14/340,765

(22) Filed: Jul. 25, 2014

(65) Prior Publication Data
US 2016/0025583 A1    Jan. 28, 2016

(51) Int. Cl.
| | | |
|---|---|---|
| *G01L 19/04* | (2006.01) | |
| *G01L 9/12* | (2006.01) | |
| *B81C 1/00* | (2006.01) | |
| *G01L 9/00* | (2006.01) | |
| *B81B 7/00* | (2006.01) | |

(52) U.S. Cl.
CPC ............. *G01L 9/12* (2013.01); *B81C 1/00158* (2013.01); *B81C 1/00285* (2013.01); *G01L 9/0073* (2013.01); *G01L 19/04* (2013.01); *B81B 7/0038* (2013.01)

(58) Field of Classification Search
CPC .......... G01L 19/12; G01L 19/00; G01L 19/04; G01L 19/0073; B81B 7/0038; B81C 1/00285; B81C 1/00158

See application file for complete search history.

(56) References Cited

U.S. PATENT DOCUMENTS

| | | | |
|---|---|---|---|
| 4,925,741 A * | 5/1990 | Wong | ..................... B21C 23/22 148/527 |
| 5,645,071 A | 7/1997 | Harnoncourt et al. | |
| 5,909,202 A | 6/1999 | Cathey | |
| 6,499,354 B1 | 12/2002 | Najafi et al. | |

(Continued)

FOREIGN PATENT DOCUMENTS

| | | | |
|---|---|---|---|
| DE | 102005008959 A1 | 9/2006 | |
| JP | 2004068127 A * | 3/2004 | ............. C25B 11/08 |
| WO | WO-2008149298 A1 | 12/2008 | |

OTHER PUBLICATIONS

Benvenuti, C., "Molecular Surface Pumping: The Getter Pumps", Aug. 19, 1999, pp. 43-50, Geneva, Switzerland.

(Continued)

*Primary Examiner* — Nguyen Ha
(74) *Attorney, Agent, or Firm* — McDermott Will & Emery LLP (57) ABSTRACT

Various exemplary embodiments relate to a pressure sensor including a pressure sensitive membrane suspended over a cavity, wherein the membrane is secured by a set of anchors to a substrate; and a getter material embedded in the membrane, wherein the surface of the getter is in contact with any gas within the cavity, and wherein two end points of the getter material are attached through the substrate by anchors capable of conducting through the substrate an electrical current through the getter material.

13 Claims, 5 Drawing Sheets

(56) References Cited

U.S. PATENT DOCUMENTS

| | | | |
|---|---|---|---|
| 6,521,965 B1* | 2/2003 | Lutz | G01L 9/0073 257/415 |
| 6,527,961 B1* | 3/2003 | Vigna | G01L 9/0055 216/2 |
| 6,645,071 B2 | 11/2003 | Perrie et al. | |
| 8,256,298 B2 | 9/2012 | Suijlen et al. | |
| 8,471,206 B1 | 6/2013 | Kostrzewa et al. | |
| 2001/0034174 A1* | 10/2001 | Moore | B82Y 10/00 445/24 |
| 2003/0085438 A1* | 5/2003 | Habibi | B81C 1/00285 257/415 |
| 2004/0197227 A1 | 10/2004 | Hauan et al. | |
| 2004/0206239 A1* | 10/2004 | Laubacher | F17C 1/00 96/108 |
| 2005/0017313 A1 | 1/2005 | Wan | |
| 2005/0262943 A1 | 12/2005 | Claydon et al. | |
| 2006/0131501 A1 | 6/2006 | Ikushima et al. | |
| 2008/0241020 A1* | 10/2008 | Miyamoto | B01J 19/0093 422/600 |
| 2010/0025845 A1* | 2/2010 | Merz | B81B 7/0038 257/723 |
| 2010/0201263 A1* | 8/2010 | Chen | H01J 29/94 313/561 |
| 2012/0006096 A1 | 1/2012 | Ackley et al. | |
| 2012/0228733 A1 | 9/2012 | Garcia-Blanco et al. | |
| 2013/0192372 A1 | 8/2013 | Colinet et al. | |
| 2013/0214400 A1* | 8/2013 | Shu | B81B 7/0038 257/682 |
| 2013/0334622 A1* | 12/2013 | Gonska | B81B 3/0018 257/415 |
| 2014/0225206 A1* | 8/2014 | Lin | B81B 7/0038 257/417 |
| 2015/0151959 A1* | 6/2015 | Baillin | B81B 7/0038 257/787 |
| 2015/0158720 A1* | 6/2015 | Lim | B81C 1/00285 257/415 |
| 2015/0353346 A1* | 12/2015 | Heuck | B81B 7/02 257/415 |
| 2016/0137493 A1* | 5/2016 | Samarao | B81C 1/00285 438/59 |

OTHER PUBLICATIONS

Chidambaram et al., "Titanium-Based Getter Solution for Wafer-Level MEMS Vacuum Packaging", Journal of Electronic Materials, vol. 42, No. 3, 2013, pp. 485-491, DOI: 10.1007/s11664-012-2350-9.

Malyshef, Dr. Oleg, "Non-Evaporable Getters", ASTeC Vacuum Science Group, STFC Daresbury Laboratory, UK, VS-2, Oct. 18-19, 2011.

Ramesham, Dr. Rajeshuni, "Evaluation of Non-Evaporable Getters for High Vacuum Hermetic Packages", Final Report (JPL D-27440), Jet Propulsion Laboratory, California Institute of Technology.

* cited by examiner

PRESSURE SENSOR WITH GETER EMBEDDED IN MEMBRANE

TECHNICAL FIELD

Various exemplary embodiments disclosed herein relate generally to getters used to regulate pressure changes caused by outgassing in the cavity of a pressure sensitive membrane.

BACKGROUND

Micro-electromechanical systems (MEMS) pressure sensors rely on an accurate measurement of the deflection of a suspended membrane (e.g. silicon or silicon nitride). Typically such sensors have well-known piezo resistive or capacitive read-outs. See, e.g., U.S. Pat. No. 8,256,298 to Suijlen et al., "MEMS pressure sensor." In order for these sensors to have an accurate reference pressure, the cavity underneath the membrane must be sealed perfectly from the environment, which poses strict constraints on the packaging used to seal the cavity. Conventional arrangements employ an expensive dual wafer bonding technique to create a hermetically sealed cavity.

Pressure sensors with a capacitive read-out have clear advantages over pressure sensors with conventional piezo resistive read-out, including very low power consumption and higher sensitivity. For example, certain pressure sensors employ a thin suspended silicon nitride (SiN) membrane as a capacitive MEMS pressure gauge. To achieve the necessary pressure reference, the cavity underneath the SiN membrane is hermitically closed using a plasma-enhanced chemical vapor deposition (PECVD) SiN sealing process. Device performance is largely determined by the physical, mechanical and structural properties of this film and the thickness necessary to prevent holes forming in the membrane. Among other performance factors, film density and composition determine out-gassing behavior and diffusion barrier properties. Internal stress and hence the sensitivity of the pressure sensor are determined by the membrane's thickness and rigidity, which are related.

Because a getter film is currently used in the art to cover the membrane, the getter material is activated once when the membrane is sealed by placing the whole structure in a heated environment.

SUMMARY

In light of the present need for preventing uncontrolled outgassing and achieve a stable cavity pressure in a MEMS pressure sensor, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a pressure sensor including a pressure sensitive membrane suspended over a cavity, wherein the membrane is secured by a set of anchors to a substrate; and a getter material embedded in the membrane, wherein the surface of the getter is in contact with any gas within the cavity, and wherein two end points of the getter material are attached through the substrate by anchors capable of conducting through the substrate an electrical current through the getter material. In alternative embodiments, the getter material includes a thin wire, which in some embodiments includes titanium (Ti), in some embodiments includes tungsten (W), and in some embodiments further includes Titanium nitride (TiN). In some embodiments, the wire is 0.7 um wide or less, and in some embodiments, the wire is 40 um long or greater.

In various embodiments, the pressure sensor further includes a second cavity connected to the cavity by a sealed channel, wherein the membrane is suspended over both cavities and the sealed channel, and the getter material is embedded in the membrane proximate to the second cavity. In some embodiments, the sealed channel protrudes laterally from the membrane and the cavity of the pressure sensor at one corner. In some embodiments, the sealed channel is smaller than 1/10th of the lateral width of the membrane. In some embodiments, the pressure sensor further includes an isolation trench surrounding the getter material. In some embodiments, the pressure sensor includes two or more thermally isolating trenches located next to the getter material. In alternative embodiments, a set of etch holes in the membrane are sealed with one of oxide or nitride.

Various exemplary embodiments relate to a method of manufacturing a pressure sensor, the method including suspending a pressure sensitive membrane over a cavity, wherein a getter wire is embedded in the membrane so that the surface of the getter wire is in contact with any gas within the cavity, and the getter wire is electrically connected to a current source; sealing the cavity hermetically by securing the membrane with anchors, wherein the current source is transmitted through the anchors; and reducing gas pressure inside the hermetically sealed cavity by heating the getter wire. In alternative embodiments, the step of heating the getter material comprises running an electrical current from the current source through the getter material.

In other embodiments, the method includes delaying heating the getter material until the pressure sensor is not in use. In further embodiments, the method includes determining the absolute external pressure irrespective of the gas pressure inside the cavity; an heating the getter material until the reading of the pressure sensor is identical to the measured absolute pressure. In some alternative embodiments, the step of heating the getter material occurs after a last step of assembly of a device in which the pressure sensor is embedded. In alternative embodiments, the membrane is suspended over both the cavity, a second cavity, and a sealed channel connecting the cavity and the second cavity, and the getter wire is embedded in the membrane proximate to the second cavity.

Various exemplary embodiments relate to a method of manufacturing a pressure sensor, the method including depositing a metal wire and at the same time suspending a pressure sensitive membrane over a cavity, wherein the wire is embedded in the membrane so that the surface of the wire is in contact with any gas within the cavity; etching a sacrificial layer; sealing etch holes in the membrane with one of oxide or nitride; and reducing gas pressure inside the cavity by heating the wire, wherein heating the wire includes transmitting a small electrical current through the wire.

It should be apparent that, in this manner, various exemplary embodiments enable achievement of a stable cavity pressure in a MEMS pressure sensor.

BRIEF DESCRIPTION OF THE DRAWINGS

In order to better understand various exemplary embodiments, reference is made to the accompanying drawings, wherein.

DETAILED DESCRIPTION

As noted above, pressure sensors with a capacitive read-out have clear advantages over pressure sensors with conventional piezo resistive read-out, including very low power consumption and higher sensitivity. Furthermore, a significant improvement can be achieved when the pressure sensitive membrane is built directly on top of an integrated read-out circuit as a single die solution, reducing parasitic capacitance and therefore, resulting in a better signal to noise ratio than stand-alone capacitive pressure sensor dies. Moreover, form factor and packaging are improved due to the construction of multiple redundant membranes on top of a CMOS instead of using individual, physically separated pressure sensor dies. In addition, performance spread is minimized because of improved matching and calibration at the die level. Also, there is a significant reduction in environmental disturbances due to on-chip shielding of for example, electromagnetic fields.

For all of these reasons, capacitive pressure sensors may be constructed on top of the final passivation layer of a CMOS read-out circuit. The pressure sensor technology may make use of common back-end of line (BEOL) layers for routing and shielding plates. The device includes a bottom electrode plate and top electrode plate separated from each other by a cavity and an isolation/etch stop layer. An essential part of the sensor is the movable membrane that deflects under a pressure applied from the outside. A change in pressure is directly correlated to a change in capacitance between the metal electrode plates.

In order to create a free-hanging membrane overlying a cavity, a sacrificial layer is deposited over the bottom electrode and etch stop layer. During the manufacturing process, the sacrificial layer can be removed through tiny holes etched in the membrane using a dry etch method, which avoids sticking. After the sacrificial etch, a suspended, perforated membrane is formed which is subsequently sealed with a SiN or SiO2 dielectric film.

For purposes of calibration and accuracy, most conventional micro machined pressure sensors use a hermetic membrane that seals a reference cavity which is at a certain gauge pressure (in an ideal case the gauge pressure is a vacuum). The external pressure can be determined because the pressure difference between the external pressure and the gauge pressure generates a force on the membrane, which causes the membrane to deflect. This deflection is then measured by piezo resistive, capacitive or optical sensors. There are several issues related to this type of pressure sensor design.

First, the gas pressure in the reference cavity needs to be very stable to avoid drift in sensor output drift over time, meaning the membrane should have a very high level of hermeticity such that no air or gas can penetrate through the membrane or along interfaces. Also, the underlying interconnect layers and the sealing layer should have a very low out-gassing rate, which is difficult to achieve because PECVD SiN films contain a lot of hydrogen, which is easily released. However, even though pressure sensors are extremely sensitive to changes in cavity pressure, cavity pressure cannot be controlled in standard piezoresistive pressure sensors, and signal drift caused by outgassing may go uncorrected.

Second, as noted above the cavity pressure needs to be as small as possible, with vacuum being optimal—if the reference cavity is at or above a certain pressure, gas inside the cavity will expand with increasing temperature according to Boyle's law ($P*V=n*R*T$), which will reduce the pressure difference over the membrane, rendering the sensor more temperature dependent and less predictably accurate.

Although air-tight cavities may be manufactured by using PECVD SiNx:Hy membranes, this solution also poses similar problems because pressure may rise in time when the membrane is exposed to harsh environments (for example, operation at elevated temperatures, or $H_2$ diffusion into the cavity from the outside environment due to H+ generation and recombination with electrons at the opposite electrode). In addition, membrane properties may differ in different conditions, and thus lead to inaccurate measurements, due to hydrogen effusion from the SiNx:Hy capping membrane, which is sensitive to PECVD deposition conditions and the resulting SiNx:Hy composition of the film. In particular, the hydrogen content of a SiNx:Hy membrane depends on the deposition conditions, with more hydrogen being incorporated if the deposition temperature is decreased.

Another complicating factor in membrane manufacturing using PECVD SiNx:Hy sealing are the post-deposition annealing conditions (i.e., before closure of the cavity). Differing conditions before the cavity is completely sealed effect the extent of out-gassing of hydrogen into the cavity. Because annealing afterwards could generate a significant pressure build-up in the cavity, it is important to cure the membrane before the cavity is closed.

It is possible to control cavity pressure variation caused by outgassing during manufacturing by applying a non evaporable getter for environmental gases such as oxygen (O2), nitrogen (N2), water ($H_2O$), carbon dioxide (CO2), carbon monoxide (CO), and hydrogen ($H_2$) into the sealed cavity.

Bulk gettering characteristics are heavily dependent on the amount of active surface area available for reaction with ambient gases. If the getter is operating at room temperature, when, for most gases, very limited bulk diffusion takes place, the surface of the getter eventually becomes saturated, or passivated, and the bulk getter ceases to scavenge gas.

As noted above, getter film is currently used in the art to cover the membrane. Several non evaporable getter materials are well known in the art. Titanium is the most widely used non-evaporable getter for UHV applications. For example, titanium-based non-evaporable getters (NEG) based on the well known principle that titanium (Ti) very easily forms compounds such as oxides at room temperature. Hydrogen can also be captured by adsorption at the grain boundaries. In order to activate Ti as, for example, an oxygen getter, a pristine, oxide free Ti interface must be created. However, Ti oxidizes very rapidly and therefore all Ti that is exposed to air and/or water vapor during typical manufacturing techniques will be covered with at least a 2-4 nm thick TiO2 film. Hence, Ti rapidly loses its getter efficiency during standard CMOS processing. In the art various methods have been used to protect the Ti from oxidation, such as covering the Ti with Nickel (Ni) or Gold (Au) metal. In order to activate the Ti after it has been metal-covered, the film/structure must be heated to 250° C. so that either the overlying metal/metal oxide diffuses into the Ti, or the Ti diffuses out, so that pristine metallic Ti is exposed.

As noted above the getter film currently used in the art to cover the membrane is activated once when the membrane is sealed by placing the whole structure in a heated environment, but this has at least two disadvantages: it is not repeatable, and exposes both the sensor and the structure to unnecessary heating that may damage other components. Because the process is not repeatable after the membrane is sealed, cavity pressure cannot be controlled in standard pressure sensors once the sensor is deployed in the field, leasing to a loss of sensor accuracy.

MEMS pressure sensors rely on an accurate measurement of the deflection of a suspended membrane with reference to a known low pressure, requiring a stable, hermetically sealed cavity underneath the membrane. To achieve a stable cavity pressure, the application of a non-evaporable getter may mitigate sensor drift due to outgassing and/or tiny leaks in the membrane. In light of the foregoing, it is desirable to control the cavity pressure of a MEMS sensor by applying a non-evaporable getter for environmental gases such as $O_2$, $N_2$, $H_2O$, $CO_2$, CO, and $H_2$ into the sealed cavity, and prevent uncontrolled outgassing.

Ti as a getter material is well known. Ti non-evaporable getter is usually sublimated from filaments made of Ti alloys (with Mo or Ta) heated up to 1500° C., the temperature at which the Ti vapor pressure is about $10^{-3}$ Torr. Titanium films provide sticking probabilities of 1-5 ($10^{-2}$) for $H_2$ and 0.4-0.6 for CO at room temperature. At room temperature all gases except $H_2$ remain on the surface, resulting in a progressive reduction of pumping speed (surface blocking). However, $H_2$ diffuses and its pumping speed is not affected by the pumped amount. The high (>30 kcal/mole) binding energies prevent desorption of gases adsorbed on Ti at practical temperatures. Again, $H_2$ is an exception, since its lower binding energy (~20 kcal/mole) permits desorption by heating. The initial pumping speed of a Ti sublimation pump may be restored by a further sublimation process. The total pumping capacity is therefore very large and depends on the available amount of Ti in the filament. Although the greatest pressure of a Ti sublimation pump is in principle unlimited; in practice it may be spoiled by the presence of rare gases and methane if pumping for these gases is inadequate.

The Ti must be activated as or after the membrane is sealed and the cavity closed. For this purpose activation temperatures are required that are relatively high (i.e. larger than 400° C.), which may cause problems. For example, in CMOS processing an annealing temperature above 400° C. could lead to degradation of interconnect performance (such as, for example, poor line resistance distribution and shifts out of the allowed Cpk range (Cpk is an index (a simple number) which measures how close a process is running to its specification limits, relative to the natural variability of the process)). One way to avoid the use of elevated temperature is to use other metals that are covering the Ti film during processing. In some applications an Ni- or Au-coated Ti film may be activated at relative low temperatures (i.e. >250° C.).

However, a difficulty is that materials with low activation points such as Au and or Ni are not allowed and therefore not available in CMOS BEOL processing. Therefore, in order to activate the Ti used as a getter, higher temperatures must be applied. One disadvantage is that this process cannot be carried out if the pressure sensor is integrated directly on a printed circuit board (PCB) and/or already used in an application (i.e. included in the components of a completed mobile phone, implant, tire, etc.), either of which have a lower melting point than the available coating film materials. Therefore, it would be desirable to achieve the maximum possible temperature to activate the getter material in the field (e.g., already in use in an application), while protecting the remaining components of the application from melting or other damage.

Referring now to the drawings, in which like numerals refer to like components or steps, there are disclosed broad aspects of various exemplary embodiments.

Figure 1:
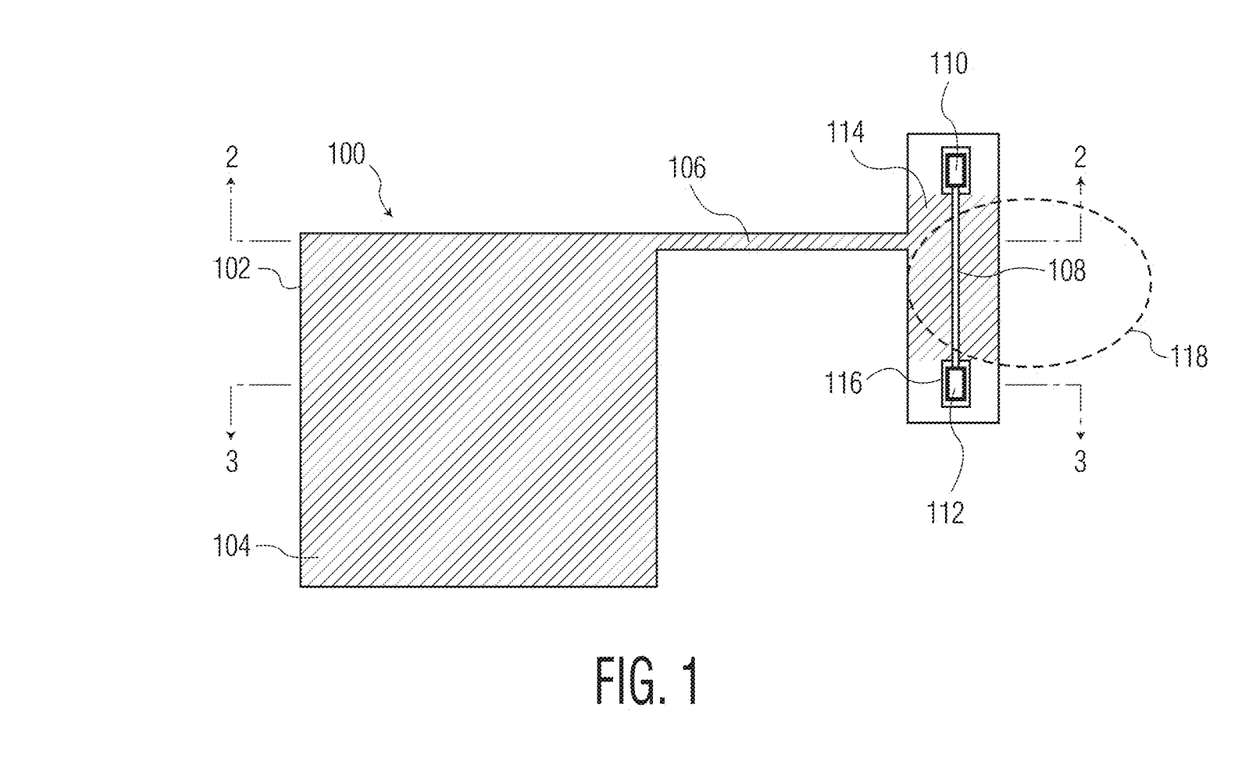
FIG. 1 illustrates an exemplary pressure sensitive membrane with an embedded getter material.

FIG. 1 shows an exemplary pressure sensor 100 with an embedded getter material 108. As shown in FIG. 1, in order to avoid the above issues related to a Ti getter film, the getter material 108 may be embedded as a thin wire 108 in a suspended membrane 114 overlying a cavity and secured by anchors 102. In some embodiments, the pressure sensitive membrane 104, 114 may be suspended over a cavity and deposited in the same process step as the Ti/W metal wire 108. The etch holes in the membrane 104, 114 may be sealed with oxide or nitride after the sacrificial layer etch.

The wire may be embedded so that the surface of the getter 108 is in contact with any gas within the cavity. An advantage of a Ti/W wire over a nanostructured film is that the getter material 108 may be regenerated and activated after deployment in the field of use, so that the material may scavenge released residual gases. The wire may be heated by a small electrical current transmitted through anchor connections 110, 112, to reach a temperature sufficient for Ti getter activation. Additionally, embedding the wire in a membrane 114 enables a higher wire temperature than if the wire was constructed on the bottom of the cavity, because a suspended wire 108 will have a higher thermal resistance towards the substrate heat sink and therefore will reach a higher temperature at the same power. This arrangement may allow high temperatures sufficient to activate the Ti getter either by sublimation of the Ti or by Ti diffusion towards the internal surface of the cavity, so that the Ti may be regenerated and react with the gas inside the cavity.

In one embodiment, the wire may be included in a separate cavity 118 connected to but removed from the pressure sensitive membrane 104 itself to ensure that the pressure sensor 100 performance is not affected by variations in heat or membrane tensility caused by the wire. In such an embodiment, a second cavity 118 may be in connection with the pressure sensor cavity via a narrow channel 106 to allow the movement of gasses between the cavities. In such an embodiment, the membrane material of the pressure sensitive membrane 104, channel 106, and separate cavity 118 may be continuous.

In some embodiments of the invention, the wire 108 may include not only Ti as getter material but also refractory materials such as, for example, Tungsten (W) and Titanium nitride (TiN). For example, W is an attractive refractory metal because it is available in CMOS fabs and starts to melt at a relatively high temperature of 3440 C, therefore it remains structurally intact during heating and remains so after sequential heating cycles, allowing regeneration of the Ti wire multiple times without the risk of deformation or "wire meltdown." In some embodiments of the invention, multiple wires may be used, spaced separately or in a bundle.

Figure 2:
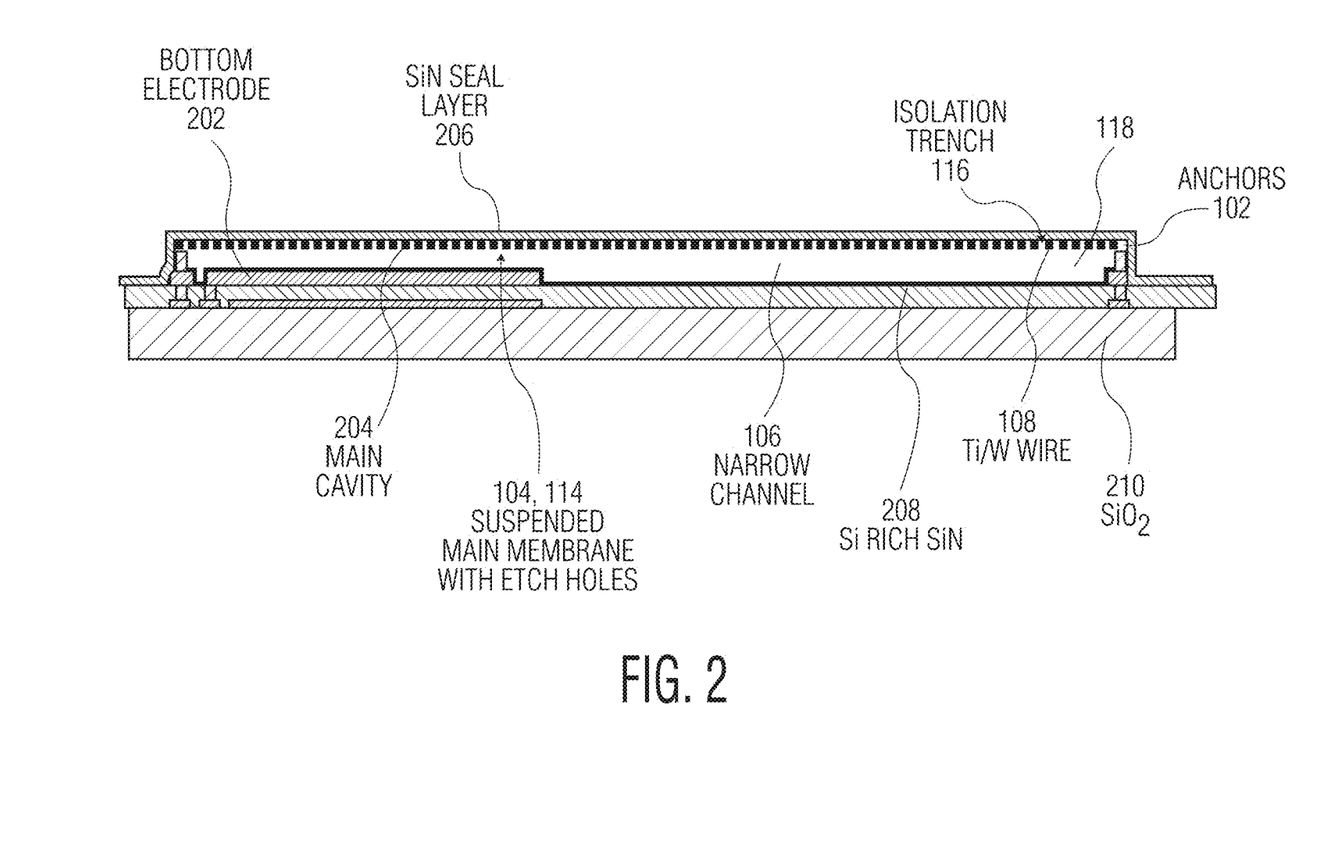
FIG. 2 illustrates a cross section of the exemplary pressure sensitive membrane of FIG. 1.
Figure 3:
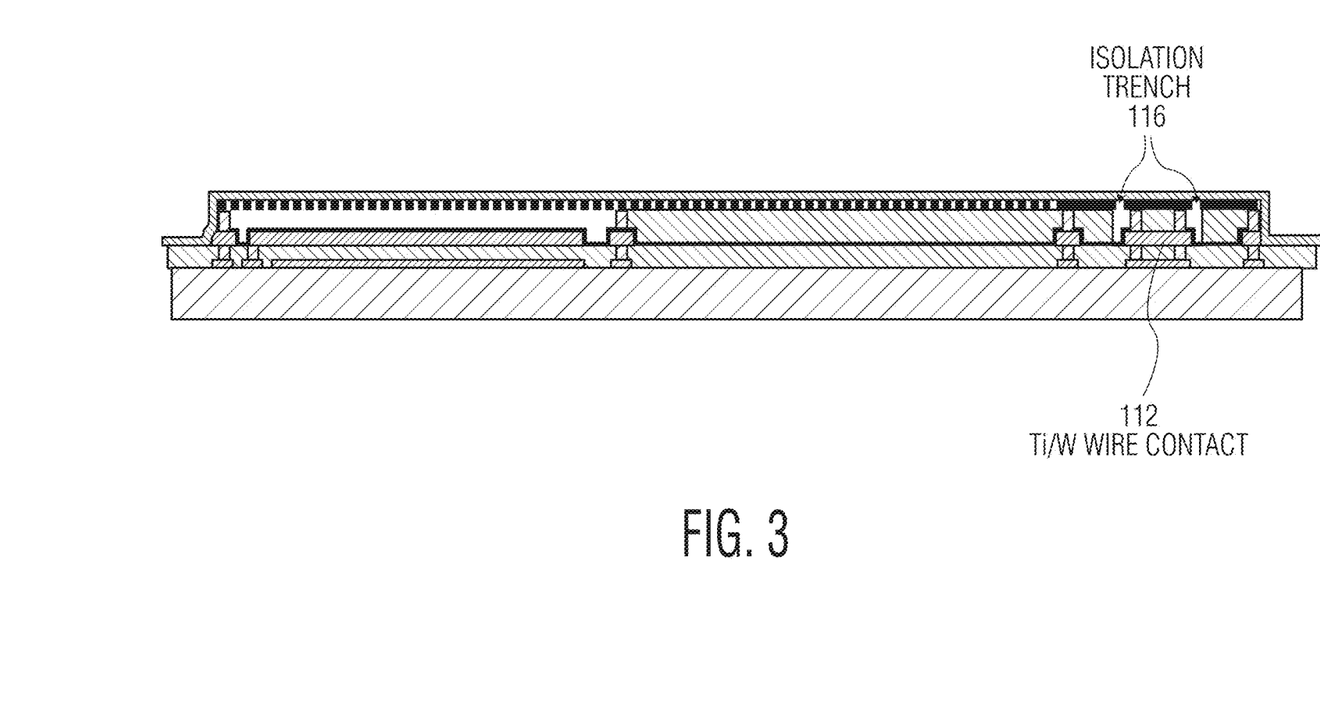
FIG. 3 illustrates another cross section of the exemplary pressure sensitive membrane of FIG. 1.

In one embodiment, as shown from above in FIG. 1, and cross sections of FIGS. 1 2-2 and 3-3, FIGS. 2 and 3, respectively, a sealed channel 106 may protrude laterally from the main suspended membrane 104 of the pressure sensor at one corner. The volume of the pressure sensor cavity 204 may be connected via the sealed channel 106 to the gas volume of the wired cavity 118. In some embodiments of the invention, an isolation trench 116 may be located next to the wire so that the center of the wire may conduct a higher temperature at the same power input without damaging the surrounding material. As shown in FIGS. 1 and 3, the wire contacts 110, 112, are within isolation trench 116. (Note as indicated in FIG. 2, the etch holes in membrane 104, 114 in FIG. 2 have been filled with SiN seal layer 206; the bottom electrode plate 202 under the pressure sensitive membrane 104, 114, and the Si rich SiN film 208 used as an etch stop, covering an SiO2 interconnect layer 210).

In various embodiments, the width of the narrow channel 106 may be small compared to the lateral dimensions of the main sensor membrane 104 to prevent changes in the mechanical properties that affect the sensor membrane shape. In one typical exemplary embodiment, where the lateral membrane dimension is 250 um, the maximum width of the channel 106 may be smaller than 1/10th of the lateral width i.e. <25 um. For the same reason, to prevent changes in the mechanical properties that affect the sensor membrane shape, the narrow channel 106 may be connected to the main membrane 104 in one of its corners—this will place the channel 106 farther from the main point of membrane pressure—the center—and reduce the additional number of points of failure of the membrane 104 caused by adding the channel 106. Where the channel 106 or channels are kept relatively small and are constructed to minimize interaction with the membrane structure 104, these additional features do not significantly influence the main membrane 104 properties, and can be ignored for purposes of membrane deflection and C-P (regression) models.

In some embodiments, the gas pressure inside of the hermetically sealed cavity 204 of a pressure sensor 100 may be reduced by heating a wire 108 containing Ti.

In one method, a feed-forward program may establish regular (periodic) heating of the Ti wire 108, which activates gas pumping or gettering. This reduces the pressure in the cavity 204 to a level that is lower than necessary for accuracy of the pressure sensor (for example, lower than 100 pascal (Pa)). In some embodiments, the pumping/gettering action may be delayed until no readout of the pressure sensor is required. In an alternative method, gas pumping or gettering may be combined with a calibration method in a feed-back arrangement. For example, a calibration step may determine the absolute external pressure irrespective of the gas pressure inside the cavity 204, and subsequently, the Ti wire pump/getter 108 may be activated until the reading of the pressure sensor is identical to the measured absolute pressure.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

In some embodiments, either or both methods of reducing the gas pressure may be applied as an initial procedure as a last step after manufacturing or assembly. In some embodiments, either or both methods might be repeated at regular intervals and/or as needed to maintain accuracy during the sensor's lifetime. For example, the activation time required to regenerate the getter may be determined by measuring the actual cavity pressure. (See, e.g., U.S. Patent Pub. No. 20130233086, "Mems capacitive pressure sensor" and U.S. Patent Pub. No. 20130118265, "Mems capacitive pressure sensor, operating method and manufacturing method").

The effectiveness of gas pumping or gettering partially depends on the degree of heat applied through the wire. In the arrangement shown in FIGS. 1-3, the heat conductivity of the heated wire relative to its environment is mainly determined by the conduction of heat through the membrane material 114 from the anchors 110, 112 of the wires 108. In exemplary arrangements where the wire 108 is embedded in the membrane 114, much higher temperatures can be achieved for the same power dissipation than if the wire 108 is attached on the bottom 208 of the cavity 204. For a single isolated wire with ambient temperature at its ends the maximum temperature is proportional to the product of voltage, current and wire length.

For a single wire 108 that may be heated on-chip, the available voltage is limited by the chip supply voltage, for example, a chip may be able to supply 1.8 V. For example, in order to dissipate 50 mW at 1 V a current of 50 mA and a resistance of 20 Ohm is needed. In such an exemplary embodiment, if the wire 108 has a cross section of 0.7×0.7 um$^2$ then the length of the wire 108 would be 196 um to produce an amount of heat sufficient to produce an acceptably effective pumping or gettering.

Figure 4:
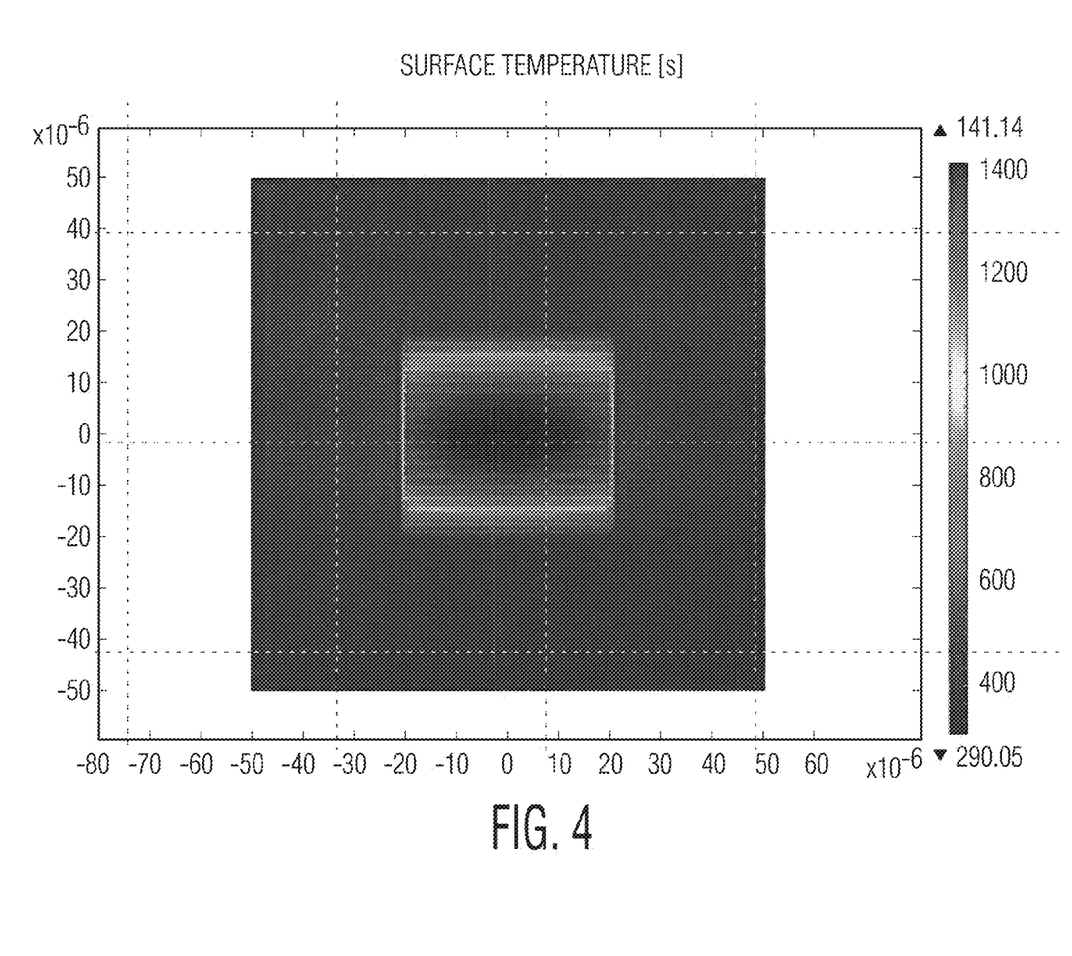
FIG. 4 illustrates a simulated temperature rise in a tungsten meander.

For example, an exemplary membrane stack (FIGS. 2, 3) may include a combination of silicon nitride, titanium, titanium nitride, and tungsten. FIG. 4 shows a simulated temperature rise 400 in a tungsten meander. In a tungsten membrane of 100×100 um$^2$ where a meander of 28 wires of 40 um long and a cross section of 0.7×0.7 um^2 is centered in the membrane 114, the wires of the meander may be electrically isolated from the surrounding tungsten by SiO2. In an arrangement where the total electrical resistance of the meander is 114 Ohm, at a current of 25 mA (and a voltage drop of 2.85 V) a temperature of 1400 K is reached after 30 us, and the power consumption is 70 mW.

Some applications may require wires of differing length to accommodate package requirements and/or membrane sizes. In cases where the wire length might be reduced, a higher current would be required to achieve the desired heat conduction. A higher current is more expensive in terms of chip area because the size of the power transistor needed to switch the current scales relative to the required maximum current.

Figure 5:
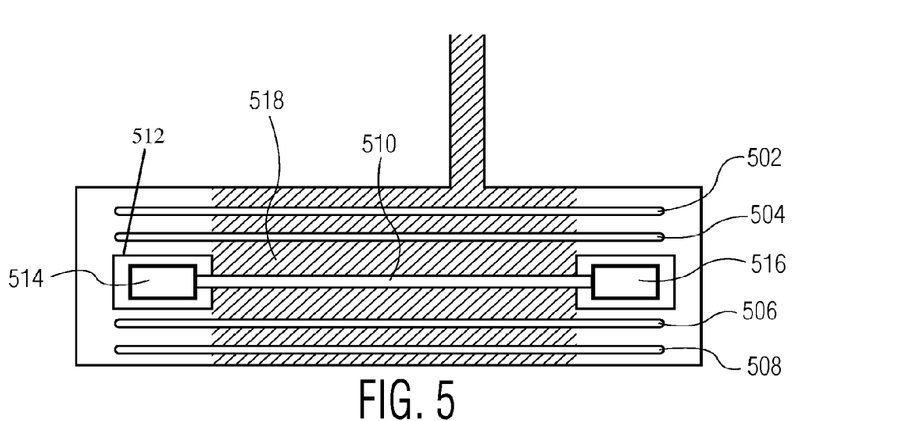
FIG. 5 illustrates an alternative configuration for a separate cavity.

An alternative embodiment to a separate cavity is shown in FIG. 5. The maximum wire temperature that can be obtained at a given power input may be determined by two design parameters, both of which are preferably as high as possible: the power dissipation of the wire per unit area, and the thermal isolation from the substrate. As shown, in addition to trench 512, which may be similar to trench 116 in FIG. 1, thermally isolating trenches 502, 504, 506, and 508 may be located next to the wire 510 so that the center of the wire may conduct a higher temperature at the same power input.

High power dissipation of the wire per unit area may be achieved by maximizing the electrical resistance per unit area of the wire 510 (for example, by using the narrowest practical width for the wire 510), and by minimizing the electrical resistance of the terminals of the fuse (for example, by making the terminals at 514, 516 as wide as is practical).

Thermal isolation from the substrate may be achieved by embedding the wire into the membrane 518 rather than locating it on the bottom of the cavity, and by maximizing the thermal resistance between the space surrounding the wire and the heat sink (for example, the anchors 520 and the substrate). Maximizing thermal resistance is particularly important for the hottest area of the wire, typically the center. Additional thermal isolation may be achieved by adding additional isolation trenches between the fuse and the surrounding membrane. Heat is mainly conducted away through the tungsten and to a much lesser extent through the isolating oxide or nitride. The heat resistance of tungsten is two orders of magnitude lower than of the sealing layer 206. In embodiments where the maximum width (i.e. distance between the wire 510 and the metal part of the membrane) is a small value (0.7 um—wider gaps cannot be filled without making the layer much thicker), the heat conductance may be adjusted by the following factors: the shape of the surrounding tungsten, the location where the surrounding tungsten connects to the substrate, and how many isolating trenches are used in proximity to each other.

As noted above, the effectiveness of gas pumping or gettering partially depends on the degree of heat applied through the wire (108, 510), and activation temperatures are required that are relatively high (i.e. larger than 400° C.). Although efficient pumping is preferable, there are physical constraints on the amount of heat that may be applied, even with high power dissipation and thermal isolation.

Figure 6:
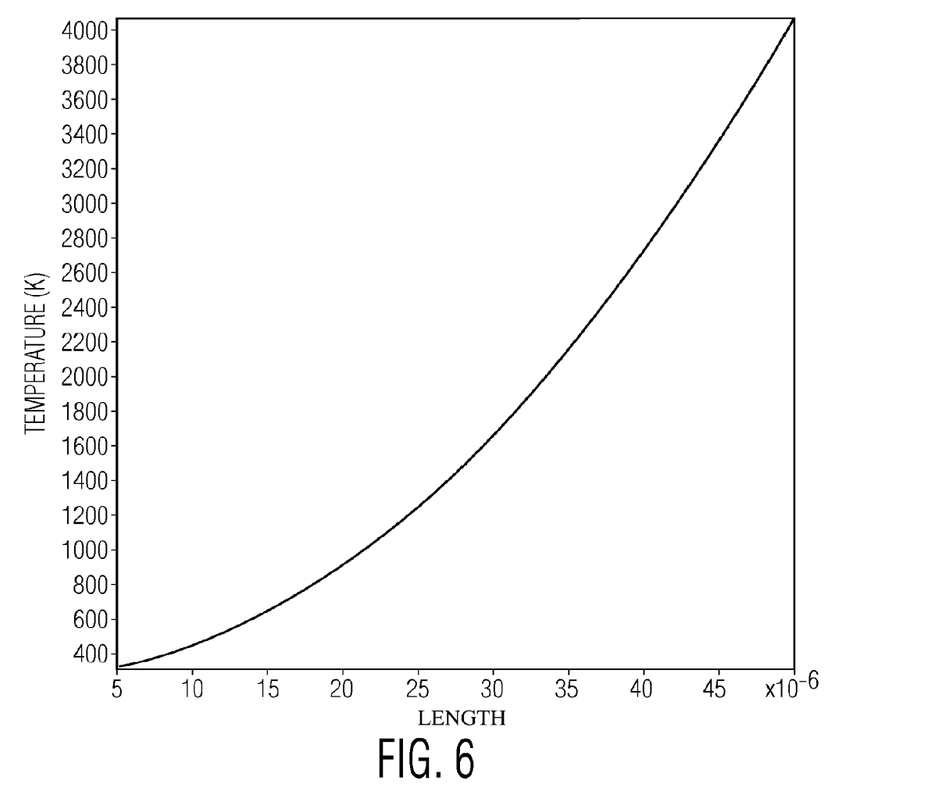
FIG. 6 illustrates an exemplary chart demonstrating the temperature in the center of the wire for 100 mA current and 0.7×0.7 cross section at different lengths.

The melting point of SiO2 is 1600° C., the melting point of tungsten is 3422° C. and the melting point of Ti is 1940° C. The temperature at which the structure of an associated device may break due to thermo-mechanical stresses will vary, but generally may be expected to be lower than 1400 K. It is possible to achieve this temperature with a typical arrangement of the invention. For example, a current of 100 mA applied to a 40 um long W wire with a 0.7×0.7 um$^2$ cross-section would generate a temperature of 2800 K, dissipated power of 40.8 mW, and voltage of 0.408 V. An exemplary chart demonstrating the temperature in the center of the wire for 100 mA current and 0.7×0.7 cross section at different lengths is shown in FIG. 6.

If the thermo-mechanical stress exceeds the fracture strength or yield stress of the materials, cracks will form that will allow gas to escape and/or enter the previously sealed cavity, which is undesirable because it will negatively affect sensor accuracy as explained above. Thermo-mechanical stresses can also cause delamination of the layers, facilitating the undesired opening of the cavity 204. Therefore, limits must be placed on the amount of heat generated in order to avoid structural failure that may otherwise be caused by activating the getter 108, 510.

The power needed for on-chip wire heating without structural failure depends upon the minimum required temperature to regenerate and activate the Ti, and the wire configuration, for example, the wire length, the heat losses towards the anchors 102, and the substrate. Wire temperatures must reach above 450 C because at those temperatures the species on the surface of the Ti start to diffuse into the Ti. For example if a TiN layer is used, the Ti underneath a TiN layer starts to diffuse through the TiN at a temperature of 450-500 C, therefore the wire must be heated at least to 450 C to cause the Ti to regenerate. The diffusion leads to fresh exposure of Ti metal which could then trap water, oxygen, nitrogen, etc., as discussed above. Further, a wire configuration may be used such that the application of a relatively large current of 100 mA would need a wire length of 18 um in order to achieve a temperature of 800 K (see FIG. 6).

A person of skill in the art will understand that different wire configurations are available depending on the layer used and constraints of the membrane. For example, if the wire is twice as long for the same current, the voltage will double and the power dissipation will double as well, resulting in a temperature 4 times higher (2^2). The degree of heat dissipation increases exponentially by the degree of length. Therefore, the same temperature may be achieved while reducing current consumption by lengthening the wire (108, 510) by a factor of two while keeping the voltage constant: the current becomes two times smaller and, consequently, the power becomes two times smaller as well. Therefore, in another example, to reduce current consumption by a factor of 10 (for example, from 100 mA to 10 mA) the wire 108, 510 may be made approximately 10 times longer, i.e. in the prior example, 180 um. All or most lengths appropriate for a pressure-sensor getter would be feasible for a sensor used in an application (i.e. included in the components of a completed mobile phone, implant, tire, etc.).

There are various advantages of controlling the cavity pressure in capacitive pressure sensors using a Ti Wire 108, 510 as shown and described, including: maintaining low cavity pressure; mitigating signal drift caused by outgassing over time; activating the getter material repeatedly using an electrical current through the Ti Wire (as opposed to heating the entire environment, and thus the entire device, (e.g. mobile phone, implant), once in order to heat a covering film; and generating heat in the membrane 114 and not dissipating heat directly into the substrate, allowing the getter (wire) 108, 510 to reach higher temperatures at lower power. Additionally, heat conduction from the heated Ti/W wire to its environment will mainly be determined by the heat conduction of the membrane material 114 to its anchors 102, made more effective by the aspect ratio of the membrane/wire. Further, a Ti/W wire 108, 510 can remain structurally intact at elevated temperatures by using a refractory metal like W in combination with Ti. Also, the Ti/W wire 108, 510 may constructed in the same process as the pressure sensitive membrane 104, 114 without using additional masks.

According to the foregoing, various exemplary embodiments provide for a getter arrangement in a pressure-sensitive membrane that can achieve the maximum possible temperature to activate the getter material in the field (e.g., already in use in an application), while protecting the remaining components of the application from melting or other damage.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A pressure sensor comprising:
a pressure sensitive membrane suspended over a cavity, wherein the membrane is secured by a set of anchors to a substrate; and
a getter material embedded in the membrane,
wherein a surface of the getter material is in contact with any gas within the cavity,
wherein two end points of the getter material are attached through the substrate by anchors capable of conducting through the substrate an electrical current through the getter material,
wherein the getter material comprises a thin wire,
wherein the wire comprises titanium (Ti), and
wherein the wire further comprises Titanium nitride (TiN).

2. The pressure sensor of claim 1, wherein the wire further comprises tungsten (W).

3. The pressure sensor of claim 1, wherein the wire is 0.7 um wide or less.

4. The pressure sensor of claim 1, wherein the wire is 40 um long or greater.

5. A pressure sensor comprising:
a pressure sensitive membrane suspended over a cavity, wherein the membrane is secured by a set of anchors to a substrate;
a getter material embedded in the membrane, wherein a surface of the getter material is in contact with any gas within the cavity, and wherein two end points of the getter material are attached through the substrate by anchors capable of conducting through the substrate an electrical current through the getter material; and
a second cavity connected to the cavity by a sealed channel, wherein the membrane is suspended over both cavities and the sealed channel, and the getter material is embedded in a membrane portion proximate to the second cavity.

6. The pressure sensor of claim 5, wherein the sealed channel protrudes laterally from the membrane and the cavity of the pressure sensor at one corner.

7. The pressure sensor of claim 5, wherein the sealed channel is smaller than 1/10th of the lateral width of the membrane.

8. A pressure sensor comprising:
a pressure sensitive membrane suspended over a cavity, wherein the membrane is secured by a set of anchors to a substrate;
a getter material embedded in the membrane, wherein a surface of the getter material is in contact with any gas within the cavity, and wherein two end points of the getter material are attached through the substrate by anchors capable of conducting through the substrate an electrical current through the getter material; and
an isolation trench surrounding the getter material.

9. A pressure sensor comprising:
a pressure sensitive membrane suspended over a cavity, wherein the membrane is secured by a set of anchors to a substrate;
a getter material embedded in the membrane, wherein a surface of the getter material is in contact with any gas within the cavity, and wherein two end points of the getter material are attached through the substrate by anchors capable of conducting through the substrate an electrical current through the getter material; and
two or more thermally isolating trenches located next to the getter material.

10. The pressure sensor of claim 1, wherein a set of etch holes in the membrane are sealed with one of oxide and nitride.

11. The pressure sensor of claim 5, wherein a set of etch holes in the membrane are sealed with one of oxide and nitride.

12. The pressure sensor of claim 8, wherein a set of etch holes in the membrane are sealed with one of oxide and nitride.

13. The pressure sensor of claim 9, wherein a set of etch holes in the membrane are sealed with one of oxide and nitride.

* * * * *

UNITED STATES PATENT AND TRADEMARK OFFICE
CERTIFICATE OF CORRECTION

PATENT NO. : 9,557,238 B2  
APPLICATION NO. : 14/340765  
DATED : January 31, 2017  
INVENTOR(S) : Willem Besling et al.

Page 1 of 1

It is certified that error appears in the above-identified patent and that said Letters Patent is hereby corrected as shown below:

On the Title Page

Item (71) Applicant should read --ams International AG-- rather than "NXP B.V."

Signed and Sealed this
Fifth Day of September, 2017

Joseph Matal
*Performing the Functions and Duties of the*
*Under Secretary of Commerce for Intellectual Property and*
*Director of the United States Patent and Trademark Office*